US012695463B2

(12) United States Patent
Bucksch et al.

(10) Patent No.: US 12,695,463 B2
(45) Date of Patent: Jul. 28, 2026

(54) LOW-LATENCY DATA ACQUISITION USING SIGMA-DELTA MODULATORS

(71) Applicant: TEXAS INSTRUMENTS INCORPORATED, Dallas, TX (US)

(72) Inventors: Roland Bucksch, Buch am Erlbach (DE); Mattia Romano, Freising (DE); Misha Ivanov, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 127 days.

(21) Appl. No.: 18/902,584

(22) Filed: Sep. 30, 2024

(65) Prior Publication Data

US 2026/0095194 A1    Apr. 2, 2026

(51) Int. Cl.
*H03M 3/00* (2006.01)
*H03H 17/06* (2006.01)

(52) U.S. Cl.
CPC ........ *H03M 3/494* (2013.01); *H03H 17/0671* (2013.01); *H03H 17/0685* (2013.01)

(58) Field of Classification Search
CPC .............. H03M 3/494; H03H 17/0671; H03H 17/0685

USPC .................................................. 341/143, 155
See application file for complete search history.

(56) References Cited

U.S. PATENT DOCUMENTS

| | | | |
|---|---|---|---|
| 4,999,798 A * | 3/1991 | McCaslin | .......... H03H 17/0671 |
| | | | 708/313 |
| 9,391,634 B1 * | 7/2016 | Rangachari | .......... H03M 3/462 |
| 9,432,043 B2 * | 8/2016 | O'Shaughnessy | .......... |
| | | | H03H 17/0685 |

* cited by examiner

*Primary Examiner* — Khai M Nguyen
(74) *Attorney, Agent, or Firm* — Xianghui Huang; Frank D. Cimino

(57) ABSTRACT

In examples, a device includes a cascade of integrators (COI) filter including an accumulator having an output and a decimator having an input coupled to the output of the accumulator. An output of the decimator is an output of the COI filter. The device includes a SINC filter including the accumulator and the decimator of the COI filter. The SINC filter further includes a differentiator having an input coupled to the output of the decimator, in which an output of the differentiator is an output of the SINC filter. The device also includes a multiplexer having an output and first and second inputs. The first input of the multiplexer is coupled to the output of the COI filter, and the second input of the multiplexer is coupled to the output of the SINC filter.

20 Claims, 6 Drawing Sheets

600

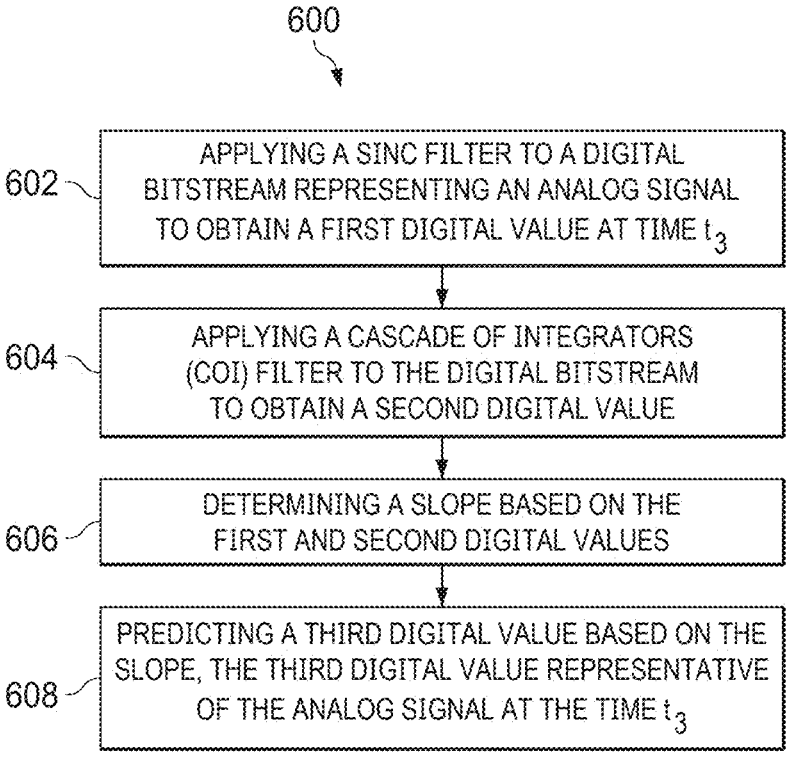

| 602 | APPLYING A SINC FILTER TO A DIGITAL BITSTREAM REPRESENTING AN ANALOG SIGNAL TO OBTAIN A FIRST DIGITAL VALUE AT TIME $t_3$ |

| 604 | APPLYING A CASCADE OF INTEGRATORS (COI) FILTER TO THE DIGITAL BITSTREAM TO OBTAIN A SECOND DIGITAL VALUE |

| 606 | DETERMINING A SLOPE BASED ON THE FIRST AND SECOND DIGITAL VALUES |

| 608 | PREDICTING A THIRD DIGITAL VALUE BASED ON THE SLOPE, THE THIRD DIGITAL VALUE REPRESENTATIVE OF THE ANALOG SIGNAL AT THE TIME $t_3$ |

FIG. 6

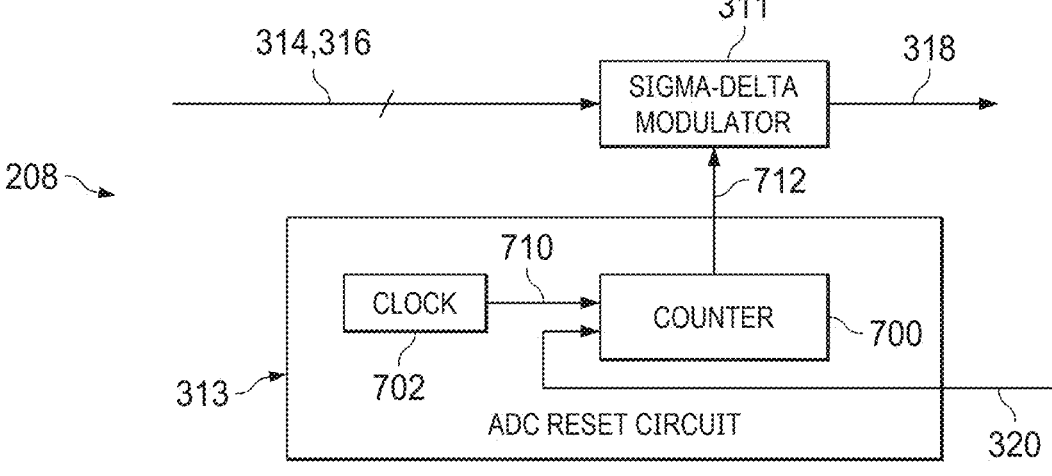

FIG. 7

LOW-LATENCY DATA ACQUISITION USING SIGMA-DELTA MODULATORS

BACKGROUND

Analog-to-digital converters (ADCs) may include any of a variety of digital filters useful in converting analog signals to digital signals. SINC filters and cascade of integrators (COI) digital filters are two examples of such ADC filters. A SINC filter is a type of decimation filter that is especially common in oversampling systems, like sigma-delta ADCs. The SINC filter may reduce the sample rate of a signal while filtering out high-frequency noise, with the "SINC" referring to the frequency response of the filter being based on the sinc mathematical function. A COI filter is similar in function to the SINC filter. The COI filter includes integrators and operates as a digital low-pass filter. Both types of filters are useful to improve the accuracy of digital signals in applications such as precision measurements and communication systems.

SUMMARY

In examples, a device includes a cascade of integrators (COI) filter including an accumulator having an output and a decimator having an input coupled to the output of the accumulator. An output of the decimator is an output of the COI filter. The device includes a SINC filter including the accumulator and the decimator of the COI filter. The SINC filter further includes a differentiator having an input coupled to the output of the decimator, in which an output of the differentiator is an output of the SINC filter. The device also includes a multiplexer having an output and first and second inputs. The first input of the multiplexer is coupled to the output of the COI filter, and the second input of the multiplexer is coupled to the output of the SINC filter. In examples, a device includes a processor and memory coupled to the processor. The memory stores instructions executable by the processor. The instructions are configured to cause the processor to: receive, at time t, a first digital value based on a SINC filter operating on a digital bitstream representing an analog signal; receive a second digital value based on a cascade of integrators (COI) filter operating on the digital bitstream; determine a slope based on the first and second digital values; and predict a third digital value based on the slope and on a filter output value of the SINC filter or the COI filter. The third digital value represents the analog signal at the time t.

In examples, a system includes an analog-to-digital converter (ADC) configured to sample an analog signal and to provide a digital bitstream based on the analog signal. The ADC includes a capacitor. The system includes a counter configured to: increment a counter value of the counter to exceed a threshold value based on a clock signal; and provide a reset signal responsive to the counter value of the counter exceeding the threshold value, in which the reset signal is configured to adjust a voltage of the capacitor. The system includes a controller coupled to the ADC and the counter. The controller is configured to: provide the clock signal to the counter; receive a first digital value based on a SINC filter operating on the digital bitstream and a second digital value based on a cascade of integrators (COI) filter operating on the digital bitstream; determine a slope based on the first and second digital values; and predict a third digital value of the analog signal based on the slope.

BRIEF DESCRIPTION OF THE DRAWINGS

FIG. 6 is a flow diagram of a process to acquire low-latency data using an SDM, in with various examples.

FIG. 7 is a block diagram of an ADC useful to acquire low-latency data, in with various examples.

DETAILED DESCRIPTION

Sigma-delta analog-to-digital converters (ADCs) commonly include SINC and COI filters to efficiently filter out high-frequency noise and provide decimation. These filters are particularly useful in oversampling systems, to reduce noise and preserve the integrity of low-frequency signals. SINC filters provide high-frequency noise suppression of second- or higher-order sigma-delta modulators by averaging the input signal over multiple integrator stages and then performing a differentiation process. COI filters perform a similar function through cascaded integrators. However, a technical challenge associated with SINC and COI filters is the tendency to introduce high latency in the output signal. This latency arises from the integration processes involved, which require the filter to process multiple samples over time before producing an output signal. In the case of SINC filters, the multiple stages of integration and differentiation each contribute to a cumulative delay. COI filters also introduce delay as the signal passes through multiple stages of integration. This latency poses meaningful limitations for sigma-delta ADCs in applications where real-time data is useful, such as in control systems, communications, or real-time monitoring.

This description presents various examples of an electronic device that acquires low-latency data using an SDM. More specifically, the electronic device, which includes SINC and COI filters, uses the output signals of the SINC and COI filters to calculate a slope (e.g., a derivative, or rate of change) of an input signal provided to SINC and COI filters. The electronic device uses the calculated slope to predict a real-time value of the SDM. By using SINC and COI filters operating in parallel, the electronic device significantly reduces data latency thereby improving performance in high-precision systems (e.g., motor applications). Further, the electronic device combines the SINC and COI filters by sharing hardware between the filters, thereby reducing the amount of hardware that would otherwise be used in a device including both SINC and COI filters. Such hardware sharing also reduces manufacturing cost and device size. The electronic device described herein also includes a circuit to reset the SDM prior to operating the combined filters, thereby facilitating proper filter operation. In examples, a device includes a processor and memory coupled to the processor. The memory stores instructions executable by the processor. The instructions cause the processor to receive, at time t, a first digital value based on a SINC filter operating on a digital bitstream representing an analog signal; receive, before time t, a second digital value based on a cascade of integrators (COI) filter operating on the digital bitstream; determine a slope based on the first and second digital values; and predict a third digital value based on the slope, the third digital value representative of the analog signal at the time t.

Figure 1:
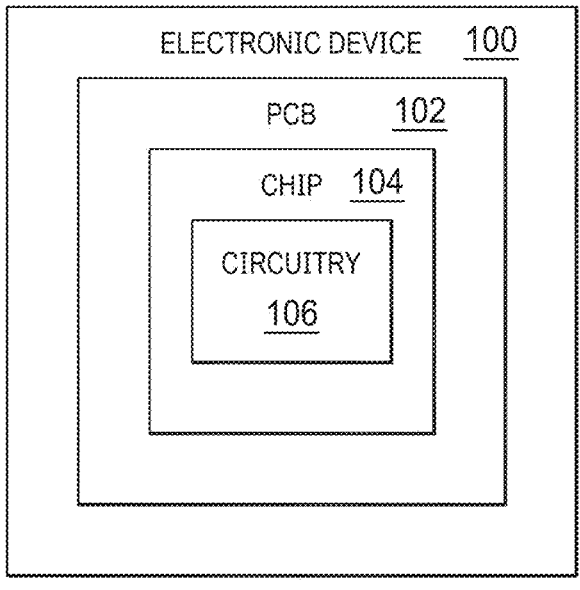
FIG. 1 is a block diagram of an electronic device that acquires low-latency data using a sigma-delta modulator (SDM), in various examples.

FIG. 1 is a block diagram of an electronic device that acquires data using a sigma-delta modulator (SDM), in various examples. Specifically, FIG. 1 depicts an electronic device 100 including a printed circuit board (PCB) 102. A chip 104 (e.g., a semiconductor package) is coupled to the PCB 102. The chip 104 includes circuitry 106. The circuitry 106 acquires low-latency data using an SDM, in various examples and as described herein. Examples of the electronic device 100 include an electrical motor drive, a direct current-to-direct current (DC-DC) converter, a power factor correction (PFC) stage, an onboard charger, an automobile, an aircraft, a watercraft, a spacecraft, a video game console, an arcade video game unit, a smartphone, an entertainment device, an appliance, a laptop computer, a desktop computer, a tablet, a notebook, or any other suitable type of electronic device or system.

Figure 2:
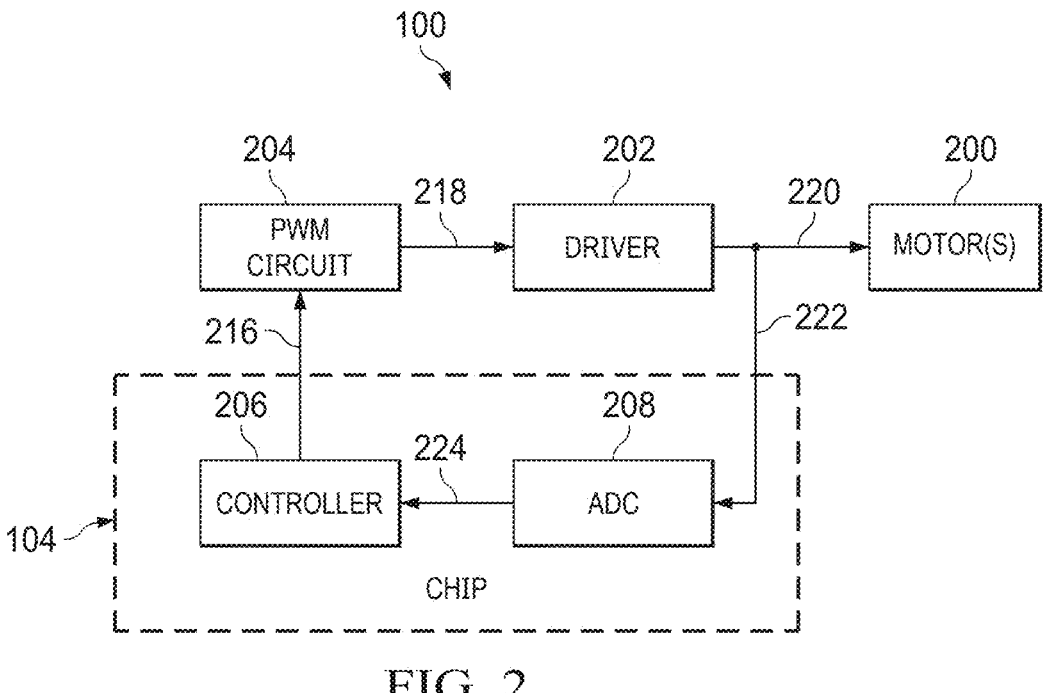
FIG. 2 is a block diagram of an electronic device that acquires low-latency data using an SDM, in with various examples.

FIG. 2 is a block diagram of an electronic device that acquires low-latency data using an SDM, in various examples. Specifically, FIG. 2 depicts an example electronic device 100 that includes a motor. For instance, the electronic device 100 depicted in FIG. 2 may be an automobile, an aircraft, a watercraft, a spacecraft, a mobile phone with a haptic motor, an autonomous guided vehicle (AGV), a robotic arm, and an alternating current (AC) inverter. The example electronic device 100 of FIG. 2 includes a chip 104, a motor 200, a motor driver 202, and a pulse width modulation (PWM) circuit 204. In some examples, the chip 104 includes a controller 206 and an analog-to-digital converter (ADC) 208. In other examples, the ADC 208 is on another chip separate from the chip 104. A connection 216 couples the controller 206 to the PWM circuit 204. Although FIG. 2 depicts the PWM circuit 204 as being separate from the controller 206, in some examples, the controller 206 includes the PWM circuit 204. A connection 218 couples the PWM circuit 204 to the driver 202. A connection 222 couples the driver 202 to the motor 200. A connection 222 couples the driver 202 to the ADC 208. A connection 224 couples the ADC 208 to the controller 206. The connections 222 and 224 and the ADC 208 form a feedback loop from the driver 202 to the controller 206. In some examples, a connection (e.g., 216, 218, 220, 222, 224) represents a coupling between an output of one component and an input of another component or represents a coupling between terminals of two or more different components. Moreover, arrows on the connections may represent direction of signal or data flow, e.g., from the output of one component to the input of another component. Connections without an arrow may represent or include a terminal of one or more components coupled to another component to receive a signal or data. For instance, connection 218 represents a coupling between an output of PWM circuit 204 and an input of driver 202.

In operation, the controller 206 operates the PWM circuit 204 to generate a train of pulses to control the driver 202. The driver 202, in turn, drives the motor 200 responsive to and based on the PWM pulse train received from the PWM circuit 204. The controller 206 uses feedback received via the feedback loop (e.g., the ADC 208 and connections 222 and 224) to adjust the manner in which the controller 206 operates the PWM circuit 204. For example, if the controller 206 determines that the output signal of the driver 202 is too high or the motor 200 is being driven for too long, the controller 206 operates the PWM circuit 204 to reduce the pulse widths in the pulse train. Conversely, if the controller 206 determines that the output signal of the driver 202 is inadequate, the controller 206 operates the PWM circuit 204 to lengthen the pulse widths in the pulse train.

The ADC 208 converts the analog signal received via the connection 222 into a digital signal. The controller 206 receives the digital signal via the connection 224 and filters the digital signal using a digital filter. The controller 206 may include multiple digital filters, such as a SINC3 (third-order SINC) filter and a COI filter. In examples, the SINC filter has an oversampling ratio (OSR) of x (e.g., 64), and the COI filter has an OSR of 2x (e.g., 128). The output values of these filters suffer from significant latency, as described in detail above. Thus, while the controller 206 could use the filter output values to adjust PWM circuit 204 operations, the feedback data on which the controller 206 would rely to implement such adjustments is outdated. Using outdated data to adjust PWM circuit 204 operations could result in a slower or less accurate response of the electronic device 100.

Thus, to mitigate the detrimental effects of such latency, the controller 206 performs a predictive process based on the output values of both filters (e.g., output values of the SINC3 and COI filters) to predict the real-time, present value of the driver 202 output signal. Stated another way, the SINC3 filter produces, at time t, a representation of the driver 202 output signal at t-1. Similarly, the COI filter produces, at time t-2, a representation of the driver 202 output signal at t-3. Instead of using these outdated filter output values to adjust the PWM circuit 204, the controller 206 uses, at time t, the outdated filter output values to predict what the driver 202 output signal would be at time t. Stated still another way, the controller 206 uses outdated filter output values to predict a real-time driver 202 output signal. The controller 206 may perform such predictions by using the outdated filter output values to calculate a slope of the analog signal provided by the driver 202. Assuming that the analog signal provided by the driver 202 is linear, the slope calculation can be used to obtain a value of the driver 202 output signal that is not outdated, meaning zero or virtually zero latency. The controller 206 may then adjust PWM circuit 204 operations using this real-time data that more accurately reflects the present state of the driver 202. In this way, the controller 206 promotes higher bandwidth and shorter response time of the control loop in the electronic device 100.

The motor application depicted in FIG. 2 is merely illustrative of one context in which the predictive techniques described herein may be implemented. Other applications may also be suitable for such predictive techniques, and this description encompasses all such applications.

Figure 3:
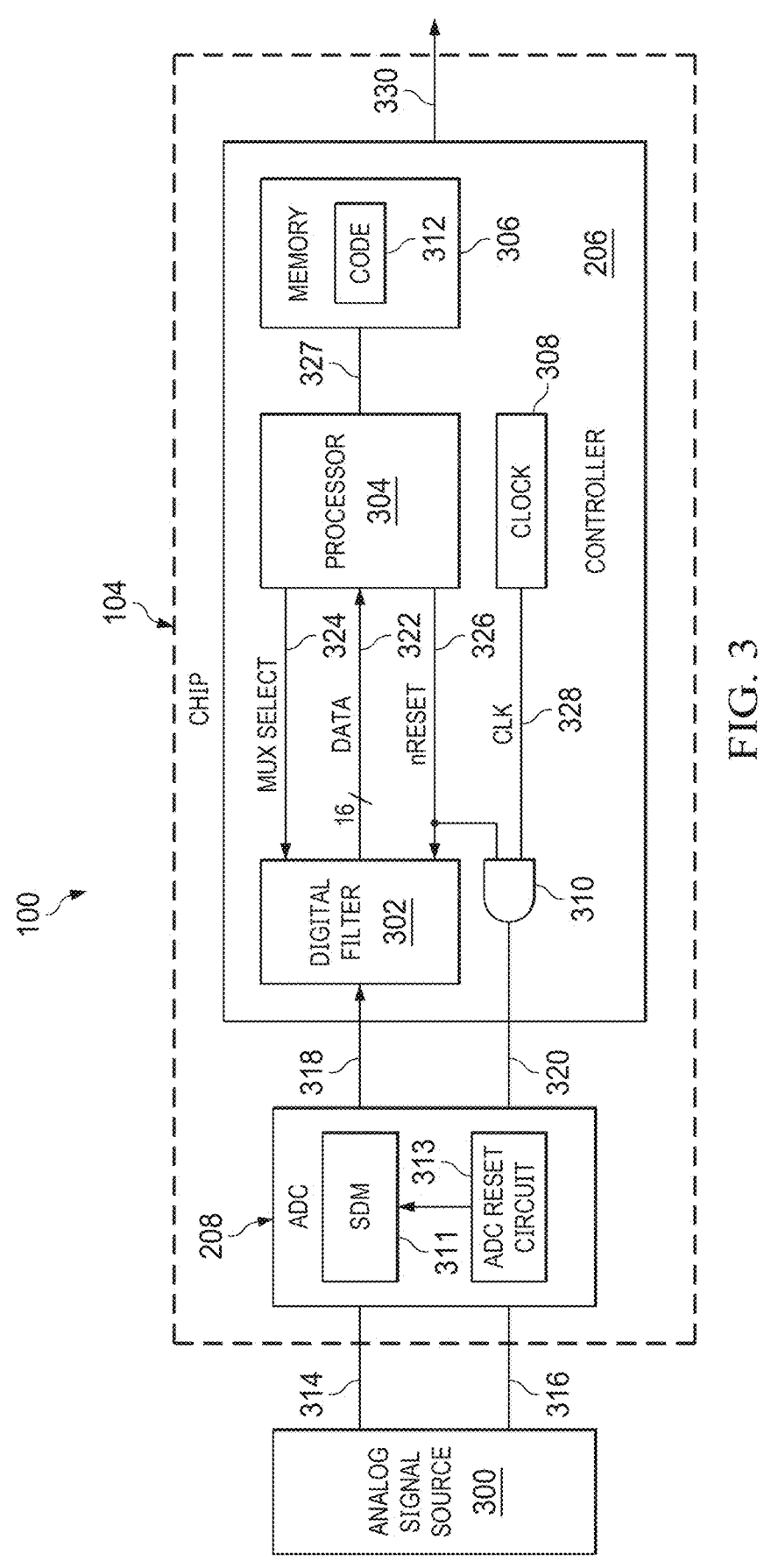
FIG. 3 is a block diagram of an electronic device that acquires low-latency data using an SDM, in with various examples.

FIG. 3 is a block diagram of an electronic device that acquires data using an SDM in various examples. Specifically, the example electronic device 100 depicted in FIG. 3 includes the chip 104 coupled to an analog signal source 300, such as the driver 202 in FIG. 2. The example chip 104 includes the controller 206 (FIG. 2) and the ADC 208 (FIG. 2). The example controller 206 includes a digital filter 302, a processor 304, memory 306 (e.g., random access memory (RAM), read-only memory (ROM)) storing executable code 312, a clock 308, and a logic gate 310 (e.g., an AND gate). The example ADC 208 includes a sigma delta modulator (SDM) 311 and an ADC reset circuit 313.

Connections 314 and 316 couple the analog signal source 300 to the ADC 208. Connection 318 couples the ADC 208 to the digital filter 302. Connection 320 couples the output of the logic gate 310 to the ADC 208. Connections 322, 324, and 326 couple the digital filter 302 to the processor 304. A connection 327 couples the processor 304 to the memory 306. The connection 326 couples to one input of the logic gate 310, and a connection 328 couples to another input of the logic gate 310. The scope of this description is not limited to the particular configuration that FIG. 3 shows. For example, other circuit components may be useful in lieu of, or in combination with, the logic gate 310.

In operation, the analog signal source 300 provides an analog signal to the ADC 208. The analog signal source 300 may provide a single-ended signal using either of the connections 314 or 316. In other examples, the analog signal source 300 provides a differential signal using both of the connections 314 and 316. The ADC 208 digitizes the analog signal. More particularly, the SDM 311 converts the analog signal into a high-frequency digital bitstream. In performing this conversion, the SDM 311 may oversample the analog signal at a higher rate than the Nyquist rate and may use noise-shaping techniques to push noise in the signal to higher frequencies to facilitate subsequent filtering. The digital filter 302 receives the digital bitstream from the SDM 311 via the connection 318. The digital filter 302 contains both a SINC filter (e.g., a SINC3 filter) and a COI filter. In some examples, the SINC filter and the COI filter share hardware to reduce electronic device 100 size and manufacturing cost, as described below. Thus, the SINC and COI filters may be collectively referred to herein as the digital filter 302. The SINC and COI filters integrate, decimate, and/or differentiate the digital bitstream received from the SDM 311 to produce multi-bit digital words (e.g., 16-bit digital words). For example, the SINC filter produces a multi-bit digital word output value, and the COI filter also produces a multi-bit digital word output value. The SINC and COI filters within the digital filter 302 may produce their respective output values at differing times. The processor 304 receives the SINC and COI filter output values via the connection 322.

The processor 304 performs a predictive process based on the received SINC and COI filter output values, both of which suffer from latency and are thus outdated, to predict the real-time value of the analog signal provided by the analog signal source 300. In a specific example, the processor 304 receives one of the filter output values, such as the COI filter output value, on the connection 322 and stores the COI filter output value to the memory 306. The processor 304 subsequently receives the other filter output value, such as the SINC filter output value, and store the SINC filter output value to the memory 306. In examples, the processor 304 also stores the times at which each of the filter output values (also referred to as filter output values) represents the analog signal provided by the analog signal source 300. The processor 304 uses the COI and SINC filter output values and time values to calculate the slope of a line that includes both of the COI and SINC filter output values. For example, if the COI filter output value is a and represents what the value of the analog signal was at time $t_1$, and if the SINC filter output value is b and represents what the value of the analog signal was at time t2, then the processor 304 may calculate the slope as:

$$m = \frac{b - a}{t_2 - t_1} \tag{1}$$

The processor 304 uses the slope as defined in (1) to calculate the predicted value of the analog signal at any suitable point in time, such as at time $t_3$, which may be when the processor 304 receives the later of the two filter output values on connection 322, or when the processor 304 performs the predictive process. For example, the processor 304 calculates:

$$y(t_3) = m(t_3 - t_2) + b \tag{2}$$

where y is the value of the analog signal at time $t_3$, m is the slope calculated using (1), and b is the output value of the SINC or COI filter at $t_2$. The processor 304 uses the predicted value $y(t_3)$ to perform a suitable action, such as to adjust operation of the PWM circuit 204 (FIG. 2). The processor 304 performs the various actions attributed herein to the processor 304 by executing the executable code 312. The controller 206 may be said to perform any of the actions attributed herein to the processor 304, since the controller 206 includes the processor 304. In examples, a suitable field programmable gate array (FPGA) or state machine is configured to perform some or all of the operations attributed herein to the processor 304 and/or the controller 206.

In an example processor 304 resets the integrators (e.g., discharge capacitors) in the SDM 311 prior to each use of the COI filter in the digital filter 302. To reset the COI filter, the processor 304 asserts the nRESET signal (e.g., using a logic high signal) on connection 326. The inputs of the logic gate 310 couple to the connections 326 and 328. Thus, when nRESET is asserted, the logic gate 310 (e.g., an AND gate) outputs a high signal whenever a clock signal CLK provided by the clock 308 on the connection 328 is high, and the logic gate 310 outputs a low signal whenever CLK is low. The nRESET signal thus operates as a gatekeeper signal, not permitting the logic gate 310 to output CLK unless the processor 304 asserts nRESET. The logic gate 310 provides a logic gate output signal on the connection 320. The processor 304 may thus selectively assert or deassert nRESET to encode specific signatures, such as pulse gaps of predetermined lengths, into the logic gate output signal. These specific signatures can trigger the ADC reset circuit 313 to take certain actions, such as to reset the capacitors in the SDM 311, as described below.

The ADC reset circuit 313 includes a counter (an example of which FIG. 7 shows, as described below), such as a watchdog counter. The counter may have two inputs. The first input is coupled to the connection 320 and receives the logic gate output signal. The second input is a clock input coupled to a clock, such as a clock internal to the ADC reset circuit 313, as described below. The counter increments a counter value responsive to the clock signal and resets the counter value with each rising and/or falling edge of the logic gate output signal. When the processor 304 introduces a gap meeting or exceeding a threshold duration in the logic gate output signal during which no rising or falling edge is present, the counter value reaches a threshold value. When the counter value reaches the threshold value, the counter triggers the SDM 311 to reset capacitors within the SDM 311. For example, the counter issues a signal to the SDM 311 that closes particular switches within the SDM 311 that shorts one or more capacitors, or that couples two or more capacitors in parallel, thereby reducing the charge in a capacitor to zero or equalizing charges across the two or more capacitors.

Upon calculating the predicted value $y(t_3)$, the processor 304 may use the predicted value to perform one or more actions. For example, the processor 304 provides a signal on the connection 330 that causes one or more actions to be performed (e.g., adjusting operation of the PWM circuit 204).

Figure 4:
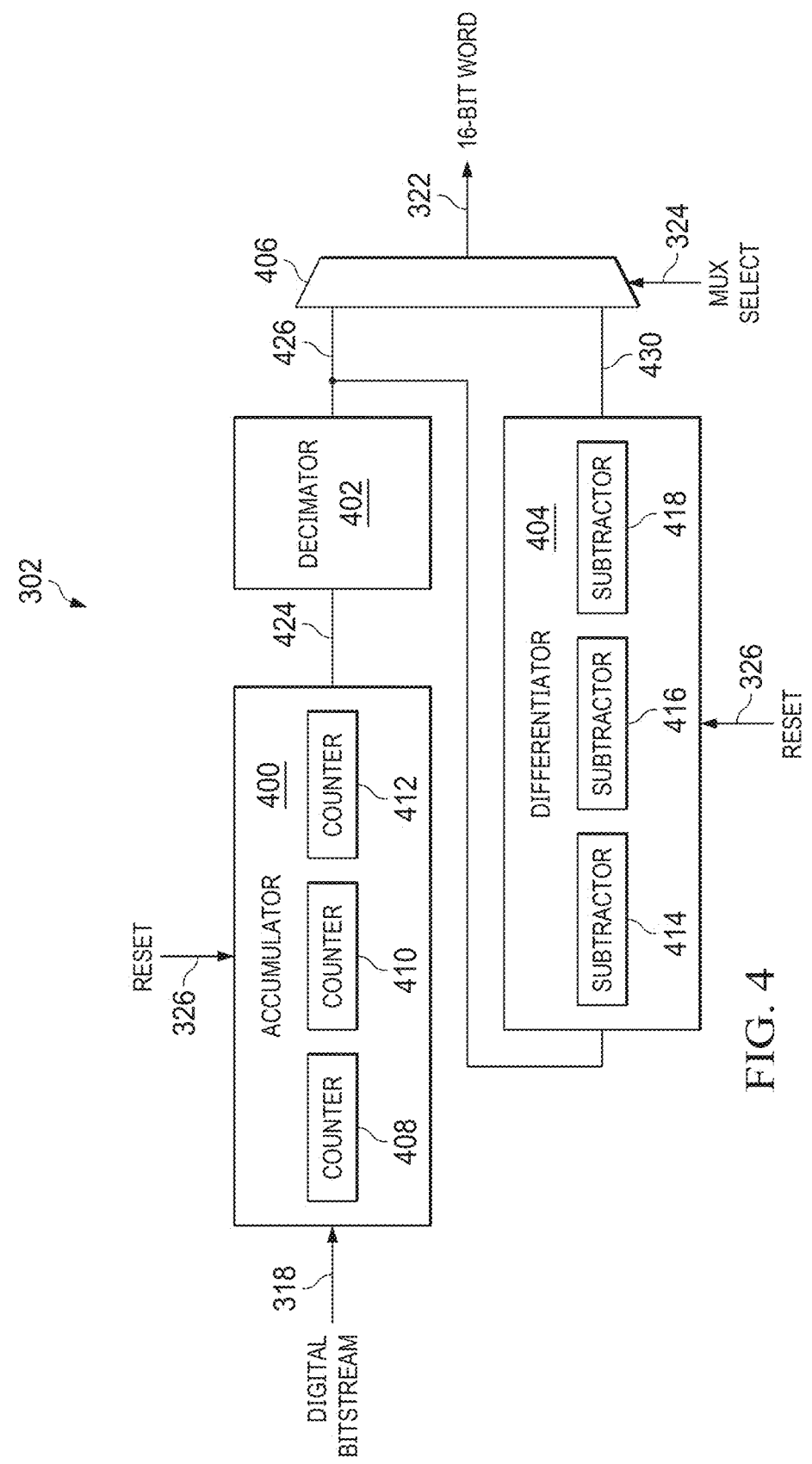
FIG. 4 is a block diagram of a digital filter combining SINC filter and COI filter elements, in with various examples.

FIG. 4 is a block diagram of a digital filter combining SINC filter and COI filter elements, in various examples. Specifically, FIG. 4 shows an example digital filter 302, which includes an accumulator 400, a decimator 402, a differentiator 404, and a multiplexer 406. The accumulator 400 includes an input coupled to connection 318 and an input coupled to connection 326. A connection 424 couples the accumulator to the decimator 402. A connection 426 couples the decimator 402 to an input of the multiplexer 406 and to the differentiator 404. A connection 430 couples the differentiator 404 to another input of the multiplexer 406. The differentiator 404 may include an input coupled to connection 326. The multiplexer 406 includes a select input coupled to connection 324 and an output coupled to connection 322.

The accumulator 400 includes counters 408, 410, and 412. The differentiator 404 includes subtractors 414, 416, and 418. The accumulator 400 may include fewer or more than three counters, and the differentiator 404 may include fewer or more than three subtractors.

As described above, the digital filter 302 includes multiple filters. In examples, the digital filter 302 includes a SINC filter, such as a SINC3 filter, and a COI filter. In examples, the accumulator 400 and the decimator 402 are the COI filter, and the accumulator 400, decimator 402, and differentiator 404 are the SINC filter. Thus, the accumulator 400 and decimator 402 are shared among the SINC and COI filters. By sharing hardware in this manner, the size and/or manufacturing cost of the electronic device 100 and/or of the chip 104 are meaningfully reduced. Because the accumulator 400 and decimator 402 compose the COI filter, the connection 426 provides the COI filter output value to an input of the multiplexer 406. Similarly, because the accumulator 400, decimator 402, and differentiator 404 compose the SINC filter, the connection 430 provides the SINC filter output value on another input of the multiplexer 406.

In operation, the accumulator 400 receives the digital bitstream on connection 318 from the ADC 208 (FIG. 3). The counter 408 increments a first counter value in response to the digital bitstream on connection 318. Specifically, each of the counters 408, 410, and 412 may operate using the same clock as the SDM 311 (FIG. 3). The counter 408 increments by 1 if the present digital value on connection 318 is 1. Counter 408 decrements by 1 if the present digital value on connection 318 is 0. Counter 410 adds the output value of counter 408 to the previous counter value of counter 410 on every clock cycle. Similarly, counter 412 adds the output value of counter 410 to the previous counter value of counter 412 on every clock cycle. This process may be known as integration or accumulation. The output value of the counter 412 is provided on the connection 424 to the decimator 402. The decimator 402 then decimates the signal received on the connection 424 by a decimation factor. The decimator 402 provides an output signal to the multiplexer 406 via the connection 426. The decimator 402 also provides that output signal to the differentiator 404. Each of the subtractors 414, 416, and 418 determines a difference between a current sample provided to that subtractor 414, 416, 418 and a delayed version of the sample. The connection 430 provides the SINC filter output value to the multiplexer 406. When the MUX select signal has a first value, the multiplexer 406 outputs the COI filter output value on the connection 322, e.g., as a 16-bit word. When the MUX select signal has a second value, the multiplexer 406 outputs the SINC filter output value on the connection 322, e.g., as a 16-bit word. The processor 304 may reset (e.g., clear) the accumulator 400 and the differentiator 404 using the reset signal on connection 326.

As described above, the example SINC and COI filters share hardware, such as the accumulator 400 and/or the decimator 402. The accumulator 400 may continuously integrate data coming from the SDM 311. The decimator 402 may capture the value of the accumulator after a number of clock cycles equal to the OSR. For example, in a $2^{nd}$-order modulator system, the SINC filter uses three of these operations in the accumulator 400, and the COI filter output value is calculated based on the second output value of the decimator 402. The multiplexer 406 selects the second output value of the decimator 402 (using the MUX select signal on input 324) and provides the second output value of the decimator 402 on the output connection 322 of the multiplexer 406. After the third decimation cycle in the decimator 402, the multiplexer 406 may select the output value of the differentiator 404 (using the MUX select signal on input 324) and provide the output value of the differentiator 404 on the output connection 322 of the multiplexer 406. The processor 304 may store values provided on the output of the multiplexer 406, such as the SINC filter and COI filter output values, in one or more registers in the processor 304. The presence of the multiplexer 406 thus enables sharing of the hardware components, such as a single accumulator 400 that is shared among the SINC and COI filters instead of a separate accumulator for each of the SINC and COI filters.

Figure 5:
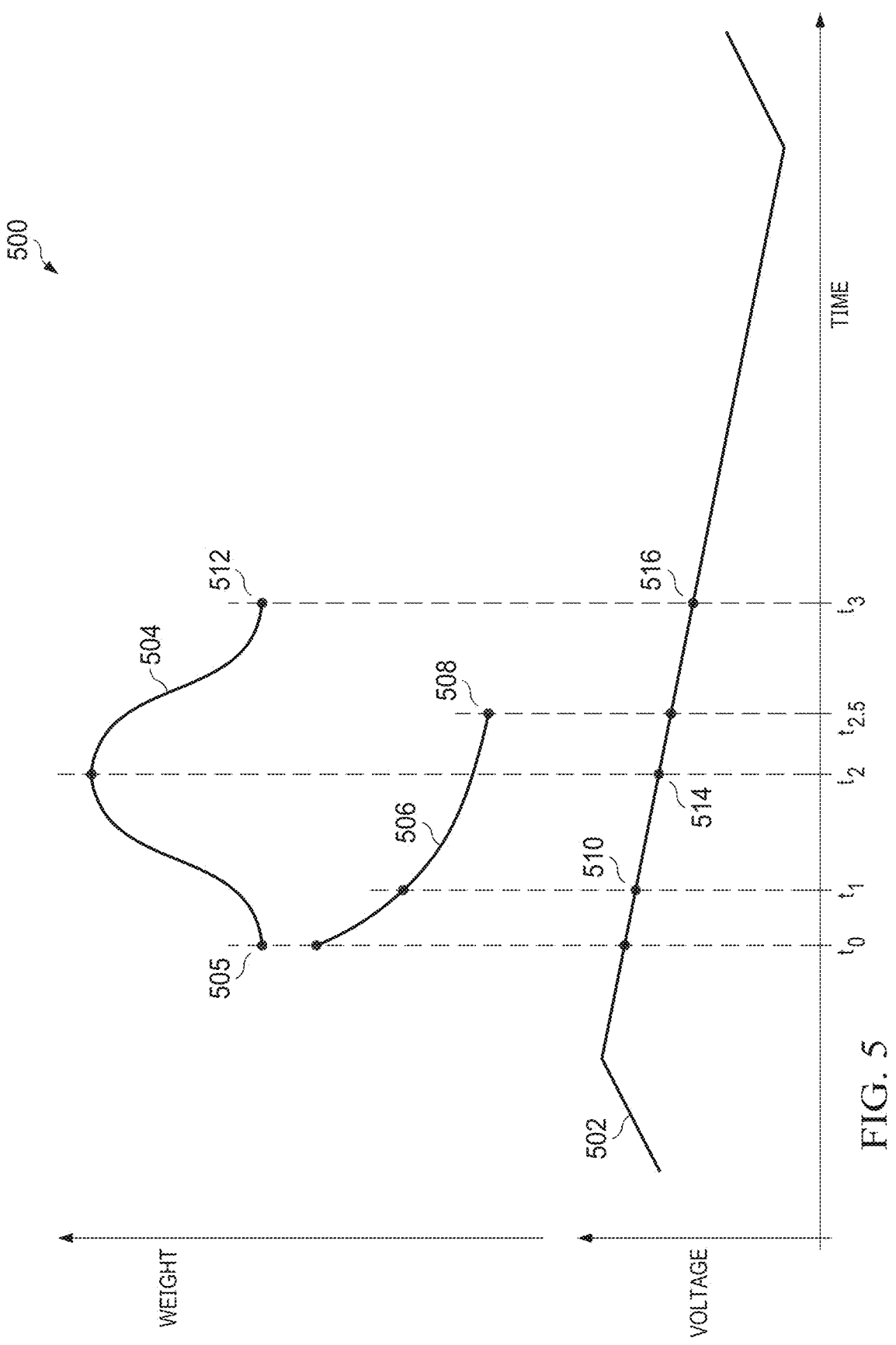
FIG. 5 is a graph depicting a process to acquire low-latency data using an SDM, in with various examples.

FIG. 5 is a graph depicting a process to acquire low-latency data using an SDM, in various examples. Specifically, a graph 500 includes a single x-axis depicting time, and dual y-axes depicting voltage (on the lower y-axis) and weight (on the upper y-axis). The graph 500 includes curves 502, 504, and 506. Curve 502 depicts the analog signal provided by the analog signal source 300 (FIG. 3). As shown, the analog signal may be linear. The curve 504 represents the operational duration of the SINC filter and the weight applied to the bits within the digital bitstream on connection 318 (FIG. 4). For example, the SINC filter begins operating at time to, indicated by numeral 505. The SINC filter completes operating at time $t_3$, indicated by numeral 512. Between times $t_0$ and $t_3$, the SINC filter samples values from the digital bitstream representing the curve 502, applying greater weight to the midpoint of this time period (time $t_2$) and lesser weight at times $t_0$ and $t_3$, in the form of a bell curve. For example, a SINC3 filter with an OSR of 64 produces a single output value based on a series of 3×64 (e.g., 192) samples from the digital bitstream. The bits in the center of that bitstream, bits 96 and 97, are weighted the highest. The first and the last bits are weighted the lowest. Similarly, as curve 506 indicates, the COI filter begins operating at time to and completes operating at a time $t_{2.5}$. The COI filter applies the greatest weight to digital bitstream values sampled at time $t_0$ and applies decreasing weights as sampling continues, with the lowest weight applied to values sampled at time $t_{2.5}$.

At the time $t_{2.5}$, the processor 304 receives the COI filter output value. The received COI filter output value represents the value of the analog signal at time $t_1$, which numeral 510 indicates. At the time that numeral 512 indicates ($t_3$), the processor 304 receives the SINC filter output value. The received SINC filter output value represents the value of the analog signal at time $t_2$, which numeral 514 indicates. At time $t_3$, the processor 304 uses the COI and SINC filter output values and the times $t_1$ and $t_2$ to calculate a slope using equation (1) above. Also at time $t_3$, the processor 304 uses equation (2) above to determine what the value of the analog signal is at time $t_3$ based on the calculated slope and one of the filter output values (e.g., one of the SINC or COI filter output values), indicated by numeral 516. Stated another way, the COI and SINC filter output values that the processor 304 receives are time-delayed due to the latency challenges described above. At numeral 508, the processor 304 receives the COI filter output value based on the COI filter operating on the above-described digital bitstream. Numeral 508 is coincident with time $t_{2.5}$, but the COI filter output value is representative of the analog signal at numeral 510 (time $t_1$) due to latency. Similarly, at numeral 512, the processor 304 receives the SINC filter output value based on the SINC filter operating on the above-described digital bitstream. Numeral 512 is coincident with time $t_3$, but the SINC filter output value is representative of the analog signal at numeral 514 (time $t_2$) due to latency. At time $t_3$, the processor 304 may benefit most from having a representation of the analog signal at time $t_3$, not at time $t_1$ or time $t_2$, which are outdated. The processor 304 thus uses the outdated filter output values representing the analog signal at numerals 510 and 514 (times $t_1$ and $t_2$, respectively) to predict the analog signal value at time $t_3$ (numeral 516). In this way, the processor 304 has a real-time, or almost real-time, representation of the analog signal.

FIG. 6 is a flow diagram of a process 600 to acquire low-latency data using an SDM, in various examples. The process 600 includes applying a SINC filter to a digital bitstream representing an analog signal to obtain a first digital value at a time $t_3$ (602). As described above, the SINC filter of the digital filter 302 (FIGS. 3 and 4) receives the digital bitstream on connection 318 and produces a SINC filter output value at time $t_3$ (FIG. 5). The process 600 may include applying a COI filter to the digital bitstream to obtain a second digital value (604). As described above, the COI filter of the digital filter 302 (FIGS. 3 and 4) receives the digital bitstream on connection 318 and produces a COI filter output value at time $t_{2.5}$. The process 600 may include determining a slope based on the first and second digital values (606). As described above, the processor 304 may calculate the slope based on the first and second digital values and the times at which those values represent the analog signal provided by the analog signal source 300 (FIG. 3). The process 600 may include predicting a third digital value based on the slope, with the third digital value representing the analog signal at the time $t_3$ or later. As described above, the processor 304 (FIG. 3) may use the slope and the time $t_3$ to determine a real-time or future representation of the analog signal (e.g., by multiplication).

FIG. 7 is a block diagram of an ADC useful to acquire low-latency data, in various examples. Specifically, and referring to FIGS. 3 and 7, an example ADC 208 includes the SDM 311 and the ADC reset circuit 313. The SDM 311 has an input coupled to the connections 314, 316. The SDM

311 has an output coupled to connection 318. The ADC reset circuit includes a counter 700 (e.g., a watchdog counter) and a clock 702. The counter 700 includes a first input that is coupled to the clock 702 by a connection 710. The counter 700 includes a second input that is coupled to connection 320. The counter 700 includes an output that is coupled to the SDM 311 by a connection 712.

As alluded above, the processor 304 may reset the integrators within the SDM 311 prior to each use of the COI filter in the digital filter 302. To do this, the processor 304 asserts nRESET, which causes the logic gate 310 to output CLK. The counter 700 increments a counter value with each pulse of the clock signal received from clock 702, and the counter 700 resets this counter value to zero with each rising or falling edge of the clock signal received on the connection 320. When the processor 304 is to reset the capacitors within the SDM 311, the processor 304 deasserts nRESET for a specific time duration, which causes the counter 700 to receive no rising or falling edges on connection 320. In the absence of rising or falling edges on the connection 320 to reset the counter value, the counter 700 continues incrementing the counter value. If the pause in rising and falling edges caused by the deassertion of nRESET continues for a threshold amount of time, the counter 700 increments the counter value beyond a threshold counter value. Responsive to the counter value exceeding the threshold counter value, the counter 700 issues a reset signal on the connection 712. The SDM 311 receives the reset signal, which may cause switches within the SDM 311 to close, thereby causing voltages of capacitors within the SDM 311 to be adjusted (e.g., brought to zero by shorting, or matched across multiple capacitors in a parallel configuration). Regardless of the state of capacitors within the SDM 311, the SDM 311 receives analog signals on connections 314 and/or 316 and provides a high-frequency, digital bitstream on connection 318, as described above.

Figure 8:
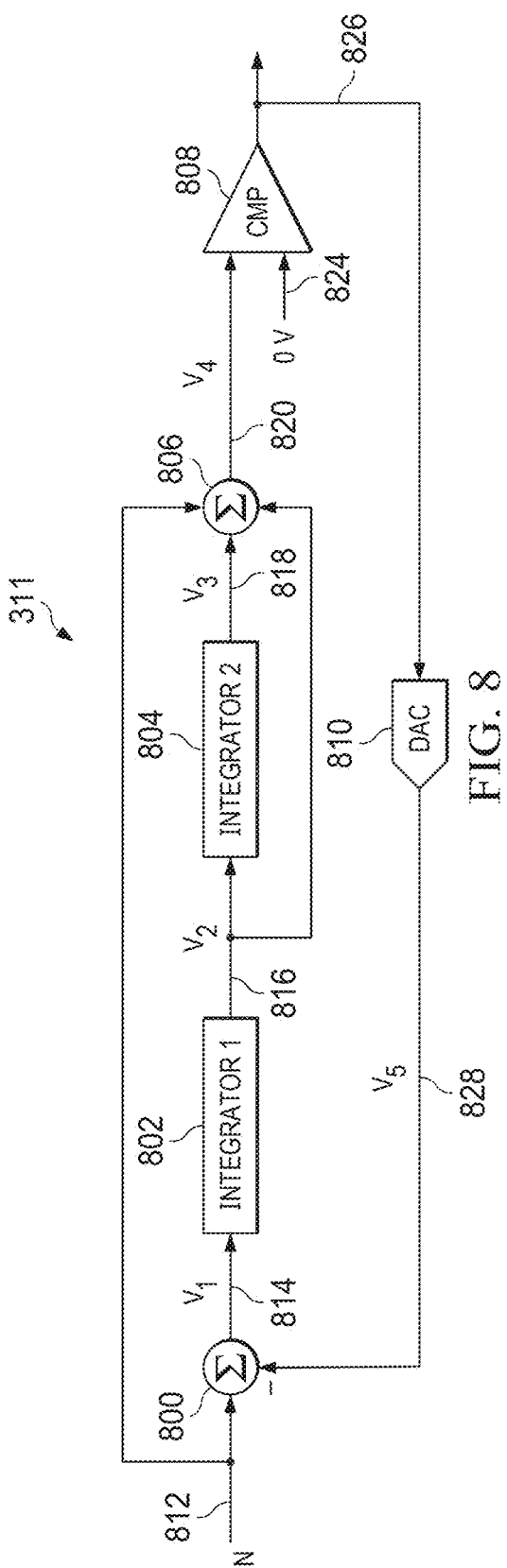
FIG. 8 is a schematic diagram of an SDM useful to acquire low-latency data, in with various examples.

FIG. 8 is a schematic diagram of an SDM useful to acquire low-latency data, in various examples. Specifically, FIG. 8 shows an example SDM 311 including a combination block 800, integrators 802 and 804, a combination block 806, a comparator 808, and a digital-to-analog converter (DAC) 810. A connection 812 is coupled to an input of the combination block 800. The connection 812 is also coupled to an input of the combination block 806. A connection 814 couples the output of the combination block 800 to an input of the integrator 802. A connection 816 couples an output of the integrator 802 to an input of the integrator 804. A connection 818 couples an output of the integrator 804 to an input of the combination block 806. A connection 820 couples an output of the combination block 806 to an input of the comparator 808. The comparator 808 also receives a reference value on an input 824. A connection 826 couples an output of the comparator 808 to an input of the DAC 810. A connection 828 couples an output of the DAC 810 to an input of the combination block 800.

VIN denotes the signal on connection 812. V1 denotes the signal on connection 814. V2 denotes the signal on connection 816. V3 denotes the signal on connection 818. V4 denotes the signal on connection 820. V5 denotes the signal on connection 828. V5 is a feedback signal.

In operation, the combination block 800 receives VIN and V5 and determines a difference between VIN and V5. V1 is the difference between VIN and V5. The integrator 802 accumulates this difference over time. The integrator 802 outputs V2. The integrator 804 receives V2 and performs the same functions as the integrator 802, adding another level of accumulation and noise shaping. The integrator 804 outputs V3. The combination block 806 combines VIN, V2, and V3 to produce V4. The comparator 808 compares V4 against the reference value on input 824 (e.g., ground or 0 volts) and produces a digital output signal on connection 826, which is provided by the SDM 311. More specifically, the comparator 808 generates the digital bitstream on connection 318 (FIG. 4), described above. VIN and the comparator 808 output influence V4. The SDM 311 regulates V4 to the reference value provided on connection 824. The higher VIN is, the more digital 1 bits the comparator 808 provides. The connection 826 provides the digital output signal to the DAC 810, which converts the digital output signal to an analog signal that is fed back to the combination block 800. The integrators 802 and 804 may contain capacitors that are reset prior to each use of the COI filter, as described above.

Figure 10:
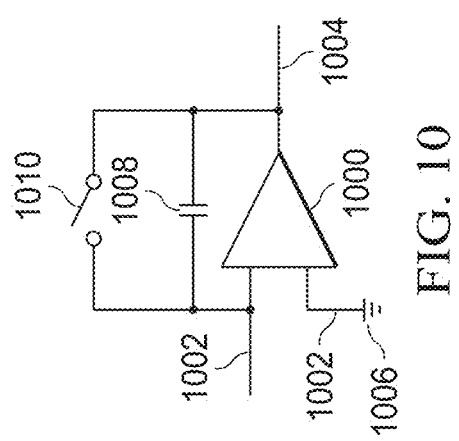
FIG. 10 is a schematic diagram of a portion of an SDM useful to acquire low-latency data, in with various examples.
Figure 9:
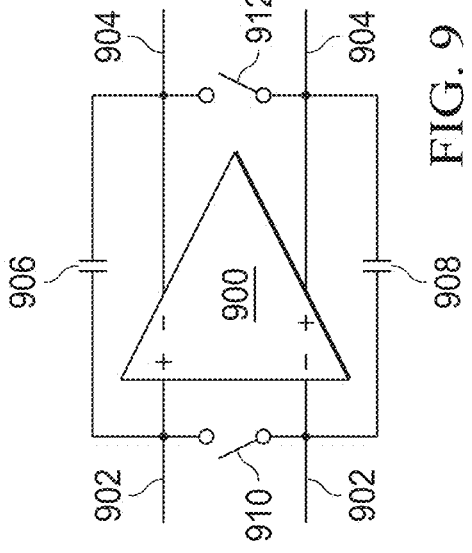
FIG. 9 is a schematic diagram of a portion of an SDM useful to acquire low-latency data, in with various examples.

FIGS. 9 and 10 depict examples of circuitry that the integrators 802 and/or 804 of FIG. 8 include. FIG. 9 depicts an amplifier 900 having two inputs 902 and two outputs 904. A capacitor 906 is coupled to the inputs 902 and 904. A capacitor 908 is coupled to a different pair of inputs 902 and 904 than is the capacitor 906. A switch 910 is coupled across the inputs 902. A switch 912 is coupled across the outputs 904. The connection 712 (FIG. 7) is coupled to control terminals of the switches 910 and 912. When the counter 700 increments the counter value above a threshold value as described above and issues a reset signal on connection 712, that reset signal may close the switches 910 and 912, thereby coupling the capacitors 906 and 908 in parallel and equalizing the voltages (or charges) across the capacitors 906 and 908. In this way, the capacitors 906 and 908 are considered to have been reset.

In FIG. 10, an amplifier 1000 has inputs 1002 and an output 1004. A ground or common terminal 1006 is coupled to one of the inputs 1002, to electrically ground the input. A capacitor 1008 is coupled to the output 1004 and the non-grounded input 1002. A switch 1010 is coupled in parallel with the capacitor 1008. A control terminal of the switch 1010 may be coupled to the connection 712 (FIG. 7). When the counter 700 increments the counter value above a threshold value as described above and issues a reset signal on connection 712, that reset signal may close the switch 1010, thereby shorting the capacitor 1008 and bringing the voltage across the capacitor 1008 to zero. In this way, the capacitor 1008 is considered to have been reset.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A device, comprising:
a cascade of integrators (COI) filter including an accumulator having an output and a decimator having an input coupled to the output of the accumulator, in which an output of the decimator is an output of the COI filter; and
a SINC filter including the accumulator and the decimator of the COI filter, the SINC filter further including a differentiator having an input coupled to the output of the decimator, in which an output of the differentiator is an output of the SINC filter; and
a multiplexer having an output and first and second inputs, the first input of the multiplexer coupled to the output of the COI filter, the second input of the multiplexer coupled to the output of the SINC filter.

2. The device of claim 1, further comprising a controller having an input coupled to the output of the multiplexer, the controller configured to:
receive a first signal from the output of the COI filter and a second signal from the output of the SINC filter;
determine a slope of an analog signal based on the first and second signals; and
use the slope to predict a digital value representative of the analog signal at time t.

3. The device of claim 2, wherein the controller is configured to use the second signal at the time t to determine a first value, use the first signal at a time prior to t to determine a second value, and determine the slope using the first and second values.

4. The device of claim 2, further comprising:
an analog-to-digital converter (ADC) configured to provide the COI and SINC filters with a digital bitstream representative of the analog signal; and
a counter configured to reset a capacitor in the ADC responsive to receiving a clock signal including a gap between consecutive pulses that exceeds a first threshold.

5. The device of claim 4, wherein the counter is configured to:
increment a counter value beyond a second threshold responsive to the gap; and
provide a reset signal responsive to the counter value exceeding the second threshold, the reset signal configured to reset the capacitor.

6. The device of claim 4, wherein the controller is configured to reset the capacitor prior to each use of the COI filter.

7. The device of claim 1, wherein the SINC filter is a third-order SINC filter, the SINC filter has an oversampling ratio of 64, and the COI filter has an oversampling ratio of 128.

8. A device, comprising:
a processor; and
memory coupled to the processor and storing instructions executable by the processor, the instructions configured to cause the processor to:
receive, at time t, a first digital value based on a SINC filter operating on a digital bitstream representing an analog signal;
receive a second digital value based on a cascade of integrators (COI) filter operating on the digital bitstream;

determine a slope based on the first and second digital values; and predict a third digital value based on the slope and on a filter output value of the SINC filter or the COI filter, the third digital value representative of the analog signal at the time t.

9. The device of claim 8, further including a digital filter coupled to the processor, the digital filter including the SINC filter and the COI filter, in which the SINC filter and the COI filter share an accumulator and a decimator.

10. The device of claim 9, wherein:

the accumulator includes an output and the decimator includes an input coupled to the output of the accumulator, in which an output of the decimator is an output of the COI filter, the SINC filter further includes a differentiator having an input coupled to the output of the decimator, in which an output of the differentiator is an output of the SINC filter, and a multiplexer having an output and first and second inputs, the first input of the multiplexer coupled to the output of the COI filter, the second input of the multiplexer coupled to the output of the SINC filter.

11. The device of claim 8, wherein the SINC filter is a 3rd order SINC filter and has an oversampling ratio (OSR) of a, and wherein the COI filter has an OSR of 2a.

12. The device of claim 8, further comprising an analog-to-digital converter (ADC) configured to provide the digital bitstream using the analog signal, the ADC including multiple capacitors.

13. The device of claim 12, wherein executing the instructions causes the processor to trigger a counter in the ADC to reset the multiple capacitors prior to each use of the COI filter.

14. A system, comprising:

an analog-to-digital converter (ADC) configured to sample an analog signal and to provide a digital bitstream based on the analog signal, the ADC including a capacitor;

a counter configured to:

increment a counter value of the counter to exceed a threshold value based on a clock signal; and provide a reset signal responsive to the counter value of the counter exceeding the threshold value, the reset signal configured to adjust a voltage of the capacitor; and a controller coupled to the ADC and the counter, the controller configured to:

provide the clock signal to the counter;

receive a first digital value based on a SINC filter operating on the digital bitstream and a second digital value based on a cascade of integrators (COI) filter operating on the digital bitstream;

determine a slope based on the first and second digital values; and predict a third digital value of the analog signal based on the slope.

15. The system of claim 14, wherein the controller further includes a digital filter, the digital filter including the SINC filter and the COI filter, in which the SINC filter and the COI filter share an accumulator and a decimator.

16. The system of claim 15, wherein the SINC filter is a $3^{rd}$ order SINC filter with an oversampling ratio of 64, and wherein the COI filter has an oversampling ratio of 128.

17. The system of claim 14, wherein the controller is configured to receive the first digital value from the SINC filter at a time t, and wherein the third digital value is representative of the analog signal at the time t.

18. The system of claim 14, wherein the counter includes an output and first and second inputs, the counter configured to:

receive a pulsed signal on the first input;

receive the clock signal on the second input;

reset the counter value based on rising and falling edges of the clock signal;

increment the counter value beyond the threshold value based on the pulsed signal and a gap in the clock signal; and provide the reset signal on the output of the counter responsive to the counter value exceeding the threshold value.

19. The system of claim 14, wherein the capacitor is a first capacitor having first and second terminals, and wherein the system includes a first switch having first and second terminals, a second switch having first and second terminals, and a second capacitor having first and second terminals, in which the first terminal of the first switch is coupled to the first terminal of the first capacitor, the second terminal of the first switch is coupled to the first terminal of the second capacitor, the first terminal of the second switch is coupled to the second terminal of the first capacitor, and the second terminal of the second switch is coupled to the second terminal of the second capacitor, wherein the switches are configured to equalize voltages across the first and second capacitors responsive to the reset signal.

20. The system of claim 14, wherein the system includes:

a motor having an input;

a motor driver having an output coupled to the input of the motor and an input, the motor driver configured to receive the analog signal on the input of the motor driver and to drive the motor responsive to the analog signal.

* * * * *